(12) United States Patent
Henderson et al.

(10) Patent No.: US 7,478,268 B2
(45) Date of Patent: Jan. 13, 2009

(54) DEALLOCATION OF MEMORY IN A LOGICALLY-PARTITIONED COMPUTER

(75) Inventors: Daniel James Henderson, Georgetown, TX (US); Alongkorn Kitamorn, Austin, TX (US); Wayne Lemmon, St George, UT (US); Naresh Nayer, Rochester, MN (US); Wade Byron Ouren, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 11/225,653

(22) Filed: Sep. 13, 2005

(65) Prior Publication Data

US 2007/0061612 A1 Mar. 15, 2007

(51) Int. Cl.
*G06F 11/00* (2006.01)
(52) U.S. Cl. ............................................. 714/5; 714/36
(58) Field of Classification Search ...................... 714/5, 714/36
See application file for complete search history.

(56) References Cited

U.S. PATENT DOCUMENTS

| | | | |
|---|---|---|---|
| 6,199,176 B1 * | 3/2001 | Greenstein et al. ............. 714/7 |
| 6,243,823 B1 * | 6/2001 | Bossen et al. .................. 714/2 |
| 6,651,182 B1 * | 11/2003 | Chang et al. ................... 714/3 |
| 6,742,100 B1 * | 5/2004 | Schnee et al. ............... 711/173 |
| 2002/0108074 A1 * | 8/2002 | Shimooka et al. ............. 714/25 |
| 2003/0212873 A1 * | 11/2003 | Lee et al. ..................... 711/170 |
| 2005/0028039 A1 | 2/2005 | Henderson et al. |

* cited by examiner

*Primary Examiner*—Marc Duncan
(74) *Attorney, Agent, or Firm*—Owen J. Gamon (57) ABSTRACT

A method, apparatus, system, and computer-readable storage medium that, in an embodiment, set uncorrectable error indicators in logical memory blocks in response to detecting an uncorrectable error in memory pages associated with the logical memory blocks. If the logical memory block is allocated to a hypervisor, the memory page may be deallocated in response to detection of the uncorrectable error. When an IPL of a partition is subsequently performed, a determination is made whether a logical memory block allocated to the partition previously encountered the uncorrectable error via the uncorrectable error indicator. If the logical memory block did previously encounter the uncorrectable error, the logical memory block is deallocated from the partition. In an embodiment, if spare memory exists, the logical memory block with the previously encountered uncorrectable error is replaced with the spare memory and the IPL of the partition is continued with the spare memory.

20 Claims, 4 Drawing Sheets

FIG. 4 ent of the invention generally relates to com-
DEALLOCATION OF MEMORY IN A LOGICALLY-PARTITIONED COMPUTER

FIELD

An embodiment of the invention generally relates to computers. In particular, an embodiment of the invention generally relates to deallocating memory in response to uncorrectable memory errors in a logically-partitioned computer.

BACKGROUND

The development of the EDVAC computer system of 1948 is often cited as the beginning of the computer era. Since that time, computer systems have evolved into extremely sophisticated devices, and computer systems may be found in many different settings. Computer systems typically include a combination of hardware, such as semiconductors and circuit boards, and software, also known as computer programs. As advances in semiconductor processing and computer architecture push the performance of the computer hardware higher, more sophisticated and complex computer software has evolved to take advantage of the higher performance of the hardware, resulting in computer systems today that are much more powerful than just a few years ago.

Today's powerful computer systems often include a large amount of memory. Protecting a system from memory errors becomes increasingly more important as the total amount of memory in a system increases. Different techniques have been used to increase the overall reliability of a system in the face of memory errors. Generally, these techniques can be categorized into one of three main areas: tolerating a correctable memory error, fixing a correctable memory error, and avoiding an uncorrectable memory error.

Several techniques can be used to tolerate correctable memory errors in a system. One such technique is the use of an error correcting code (ECC) memory. An ECC memory is a memory system that tests for and corrects errors automatically, very often without the operating system or the user being aware of the error or the correction. When writing the data into memory, ECC circuitry generates checksums from the binary sequences in the bytes and stores them in an additional seven bits of memory for 32-bit data paths or eight bits for 64-bit paths (other ECCs may use 12 or 16 bits, for example.) When data is retrieved from memory, the checksum is recomputed to determine if any of the data bits have been corrupted. Such systems can typically detect and automatically correct errors of one bit per word and can detect, but not correct, errors greater than one bit. A memory word that is protected with ECC is referred to herein as an ECC word.

Another technique for tolerating memory errors is bit-scattering, sometimes known as Chipkill detection and correction. Bit-scattering is a technique of allocating bits within an ECC word, such that any given ECC word contains no more than one bit from a given memory module. This technique ensures that even a catastrophic failure of a memory module, while it may cause multiple ECC words to have a correctable error, cannot by itself result in an uncorrectable memory error.

The aforementioned techniques, while they correct the data actually used by the system, do not eliminate the errors at the memory module level. That is, with these techniques, a system that experienced a catastrophic memory module failure would constantly have a correctable error in each ECC word to which it contributes. Any error in any other module in any of these ECC words would then result in an uncorrectable error.

Another technique for tolerating memory errors is memory-mirroring. Memory mirroring is a technique that requires double the amount of memory in a system than will logically be seen by the operating system. Each memory write is actually sent to two different ECC words in separate memory hardware. An uncorrectable error in an ECC word would not be uncorrectable in such a system because the word with the error would be re-fetched from the redundant ECC word. This technique gives very high tolerance to errors, but is an expensive approach especially for systems with a large amount of memory.

If a memory error is a random soft event, i.e. a fixable event, such as that caused by an alpha or cosmic ray particle, it is possible to fix the memory error so that it is not encountered again. This can be done when a correctable memory error is encountered. It can also be done proactively before the memory with the error is accessed by the operating system or system firmware. The most common technique for fixing random soft memory errors is memory scrubbing. Memory scrubbing is a technique for proactively correcting soft event memory errors. Memory scrubbing involves reading memory in a system, looking for an error, and writing back good "ECC corrected" data when an error is found.

Memory scrubbing can be accomplished by hardware in the background of the operating system during system operation. In such a technique, all of the memory in the system can be scrubbed regardless of how the memory is used by any software layer. Scrubbing can be performed ideally without a performance impact. Some hardware scrubbing mechanisms may also be superior to software techniques in that they can tolerate encountering uncorrectable errors when reading memory during a scrub cycle and potentially fix one of the bits in the uncorrectable error before system software ever accessed the faulty ECC word.

While the aforementioned techniques deal with correctable memory errors, some errors are uncorrectable, so the system needs a mechanism for avoiding errors that cannot be corrected. In addition, if the error remains in the system memory, it is worthwhile to avoid the error, even though the error may be correctable, to prevent a future alignment of the correctable error with another correctable error in the same ECC word, which would result in an uncorrectable error. Some techniques for avoiding a memory error include redundancy and deallocation.

Redundancy is perhaps the best mechanism for avoiding a memory error and involves substituting good memory for the faulty memory. This requires that there be some amount of redundant memory available. From a protection point of view, the best case is full memory redundancy. In systems with full memory redundancy, each memory write can be mirrored to a redundant module allowing complete memory protection even for uncorrectable errors. Full memory redundancy, however, is the most expensive technique for providing memory protection and is often not practical in large system environments where memory becomes too expensive to completely duplicate for protection purposes.

Other schemes for redundancy allow for some extra memory to be included in the system and used when needed. One such technique is redundant bit steering, or redundant bit line steering. Redundant bit steering presumes that a memory module has at least one spare memory bit. In this scheme, a memory module with a bad system memory bit could have the bit excluded from an ECC word and replaced with a system memory bit from a spare memory module. Having an entire spare memory module ensures that a catastrophic failure of a memory module could be entirely repaired by replacing each system bit with that from the spare memory module.

Absent actual redundancy, another mechanism for avoiding a memory error is to not allow the system to make use of the memory with the error by deallocating the memory that has the error. This mechanism is known as deallocation of memory and is typically done only in hardware when a system is restarted. Alternatively, deallocation of memory may be performed in software dynamically during system operation with the cooperation of the operating system.

Dynamic deallocation may be performed by allowing all of the memory to be available to the operating system, but to communicate to the operating system what portion of the memory should be avoided. This is typically done in terms of memory "pages" where a memory page is a fixed-size collection of memory words at successive memory addresses. Thus, the deallocation of memory pages is referred to as memory page deallocation or dynamic memory page deallocation if it can be done during system operation when a memory error is detected without needing to restart the computing system or operating system.

Memory page deallocation may provide advantages over simply deallocating memory at the hardware level. Generally, memory page deallocation allows a smaller amount of memory to be deallocated than is possible to be deconfigured at the hardware level. Hardware deallocation of memory can also affect the way the different ECC word are interleaved at an address level and this may affect the performance of the computing system.

Some computers implement the concept of logical partitioning, which poses challenges for page deallocation. In logical partitioning, a single physical computer is permitted to operate essentially like multiple and independent virtual computers, referred to as logical partitions, with the various resources in the physical computer (e.g., processors, memory, and input/output devices) allocated among the various logical partitions. Each logical partition executes a separate operating system, and from the perspective of users and of the software applications executing on the logical partition, operates as a fully independent computer. Each of the multiple operating systems runs in a separate partition, which operates under the control of a partition manager or hypervisor.

Page deallocation requires the cooperation of the operating system of the logical partition, and therefore, the operating system must be executing in order to deallocate the page. But, in a logically-partitioned computer, a partition may have allocated pages even though the operating system for that partition is not necessarily executing. In addition, even if the operating system is executing, the operating system might not be able to deallocate the page because the page is in pinned or bolted memory. Further, an uncorrectable memory error can cause the memory error to persist and may prevent the partition and its operating system from initializing, so that the operating system, whose cooperation is required to deallocate the page, is prevented from booting to the point where it can deallocate the page. Finally, if the uncorrectable error is in the boot, or initialization, path, the partition cannot IPL (initial program load) or initialize until the entire computer system is rebooted, which causes inconvenience and delay for all users of the computer system, not just users of the partition that encountered the memory error.

Thus, a different technique is needed for deallocating memory in logically-partitioned computers that have encountered uncorrectable errors.

SUMMARY

A method, apparatus, system, and computer-readable storage medium are provided that, in an embodiment, set uncorrectable error indicators in logical memory blocks in response to detecting an uncorrectable error in memory pages associated with the logical memory blocks. If the logical memory block is allocated to a hypervisor, the memory page may be deallocated in response to detection of the uncorrectable error. When an IPL of a partition is subsequently performed, a determination is made whether a logical memory block allocated to the partition previously encountered the uncorrectable error via the uncorrectable error indicator. If the logical memory block did previously encounter the uncorrectable error, the logical memory block is deallocated from the partition. In an embodiment, if spare memory exists, the logical memory block with the previously encountered uncorrectable error is replaced with the spare memory and the IPL of the partition is continued with the spare memory. If spare memory does not exist, the IPL of the partition is continued without the logical memory block that previously encountered the uncorrectable error. This allows a partition to IPL if it had not been able to because of a persistent uncorrectable error in its IPL path.

BRIEF DESCRIPTION OF THE DRAWINGS

Various embodiments of the present invention are hereinafter described in conjunction with the appended drawings.

It is to be noted, however, that the appended drawings illustrate only example embodiments of the invention, and are therefore not considered limiting of its scope, for the invention may admit to other equally effective embodiments.

DETAILED DESCRIPTION

Figure 1:
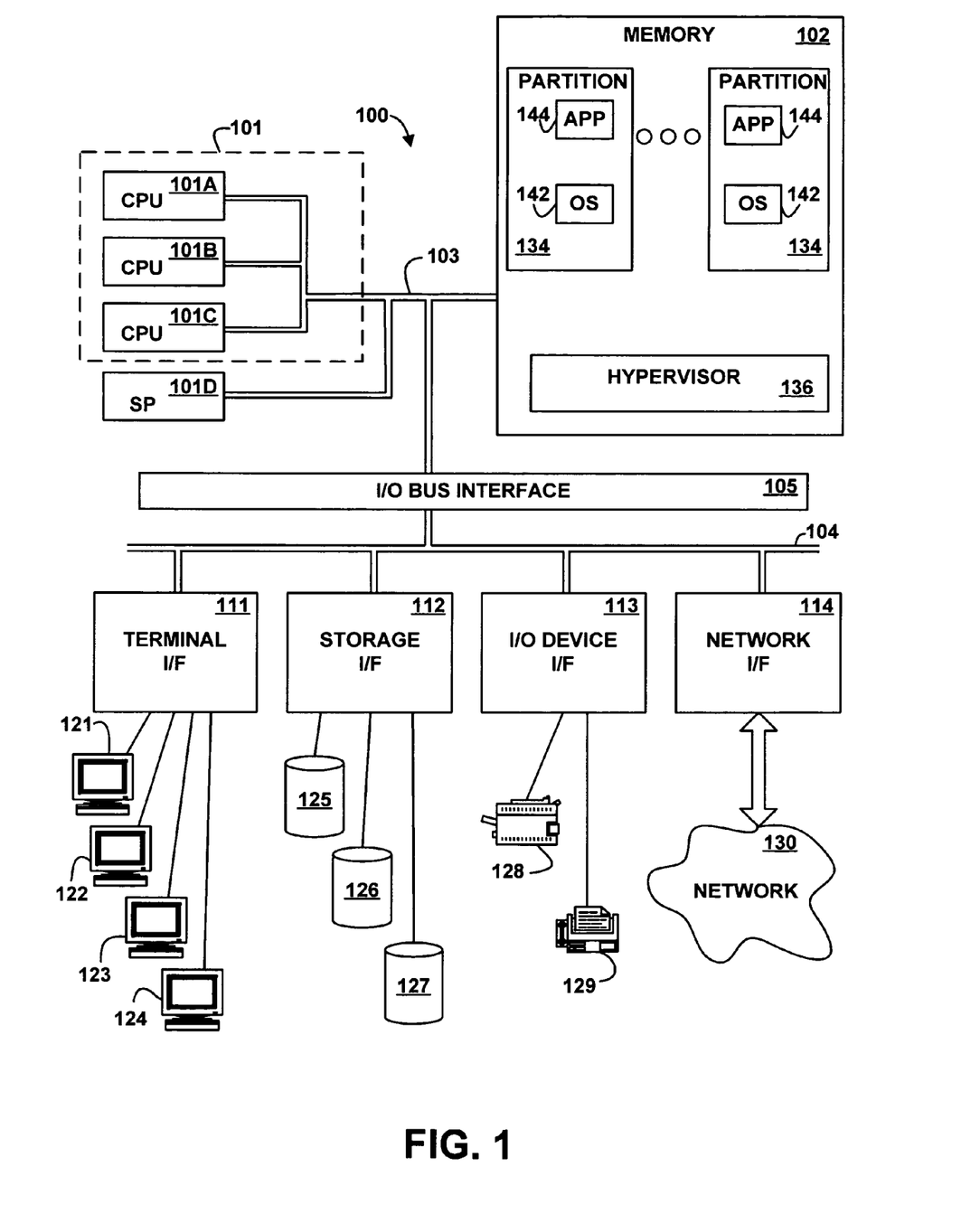
FIG. 1 depicts a block diagram of an example system for implementing an embodiment of the invention.

Referring to the Drawings, wherein like numbers denote like parts throughout the several views, FIG. 1 depicts a high-level block diagram representation of a computer system 100 connected to a network 130, according to an embodiment of the present invention. The major components of the computer system 100 include one or more processors 101, a main memory 102, a terminal interface 111, a storage interface 112, an I/O (Input/Output) device interface 113, and communications/network interfaces 114, all of which are coupled for inter-component communication via a memory bus 103, an I/O bus 104, and an I/O bus interface unit 105.

The computer system 100 contains one or more general-purpose programmable central processing units (CPUs) 101A, 101B, and 101C, herein generically referred to as a processor 101. In an embodiment, the computer system 100 contains multiple processors typical of a relatively large system; however, in another embodiment the computer system 100 may alternatively be a single CPU system. Each processor 101 executes instructions stored in the main memory 102 and may include one or more levels of on-board cache.

The computer system 100 may also include a service processor 101D, which executes instructions independent of the other processors 101A, 101B, and 101C and the memory 102. The service processor 101D is capable of being informed whenever the hardware detects a memory error including, but not limited to, the service processor 101D detecting an uncorrectable error while scrubbing memory in the background. In various embodiments, the service processor 101D may have other duties besides handling memory errors, or the service processor 101D may be dedicated to handling memory errors.

The main memory 102 is a random-access semiconductor memory for storing data and programs. The main memory 102 is conceptually a single monolithic entity, but in other embodiments the main memory 102 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may further be distributed and associated with different CPUs or sets of CPUs, as is known in any of various so-called non-uniform memory access (NUMA) computer architectures.

The memory 102 is illustrated as containing the primary software components and resources utilized in implementing a logically-partitioned computing environment on the computer 100, including a plurality of logical partitions 134 managed by a partition manager or hypervisor 136. Although the partitions 134 and the hypervisor 136 are illustrated as being contained within the memory 102 in the computer system 100, in other embodiments some or all of them may be on different computer systems and may be accessed remotely, e.g., via the network 130. Further, the computer system 100 may use virtual addressing mechanisms that allow the programs of the computer system 100 to behave as if they only have access to a large, single storage entity instead of access to multiple, smaller storage entities. Thus, while the partitions 134 and the hypervisor 136 are illustrated as residing in the memory 102, these elements are not necessarily all completely contained in the same storage device at the same time.

Each of the logical partitions 134 utilizes an operating system 142, which controls the primary operations of the logical partition 134 in the same manner as the operating system of a non-partitioned computer. For example, each operating system 142 may be implemented using the i5OS operating system available from International Business Machines Corporation, but in other embodiments the operating system 142 may be Linux, AIX, UNIX, Microsoft Windows, or any appropriate operating system. Also, some or all of the operating systems 142 may be the same or different from each other. Any number of logical partitions 134 may be supported as is well known in the art, and the number of the logical partitions 134 resident at any time in the computer 100 may change dynamically as partitions are added or removed from the computer 100.

Each of the logical partition 134 executes in a separate, or independent, memory space, and thus each logical partition acts much the same as an independent, non-partitioned computer from the perspective of each application 144 that executes in each such logical partition. As such, user applications typically do not require any special configuration for use in a partitioned environment. Given the nature of logical partitions 134 as separate virtual computers, it may be desirable to support inter-partition communication to permit the logical partitions to communicate with one another as if the logical partitions were on separate physical machines. As such, in some implementations it may be desirable to support an unillustrated virtual local area network (LAN) adapter associated with the hypervisor 136 to permit the logical partitions 134 to communicate with one another via a networking protocol such as the Ethernet protocol. In another embodiment, the virtual network adapter may bridge to a physical adapter, such as the network interface adapter 114. Other manners of supporting communication between partitions may also be supported consistent with embodiments of the invention.

Although the hypervisor 136 is illustrated as being within the memory 102, in other embodiments, all or a portion of the hypervisor 136 may be implemented in firmware or hardware. The hypervisor 136 may perform both low-level partition management functions, such as page table management and may also perform higher-level partition management functions, such as creating and deleting partitions, concurrent I/O maintenance, allocating and deallocating processors, memory and other hardware or software resources to the various partitions 134.

In an embodiment, the hypervisor 136 includes instructions capable of executing on the processor 101 or statements capable of being interpreted by instructions executing on the processor 101 to perform the functions as further described below with reference to FIGS. 3 and 4. In another embodiment, the hypervisor 136 may be implemented in microcode or firmware. In another embodiment, the hypervisor 136 may be implemented in hardware via logic gates and/or other appropriate hardware techniques.

The hypervisor 136 statically and/or dynamically allocates to each logical partition 134 a portion of the available resources in computer 100. For example, each logical partition 134 may be allocated one or more of the processors 101 and/or one or more hardware threads, as well as a portion of the available memory space. The logical partitions 134 can share specific software and/or hardware resources such as the processors 101, such that a given resource may be utilized by more than one logical partition. In the alternative, software and hardware resources can be allocated to only one logical partition 134 at a time. Additional resources, e.g., mass storage, backup storage, user input, network connections, and the I/O adapters therefor, are typically allocated to one or more of the logical partitions 134. Resources may be allocated in a number of manners, e.g., on a bus-by-bus basis, or on a resource-by-resource basis, with multiple logical partitions sharing resources on the same bus. Some resources may even be allocated to multiple logical partitions at a time. The resources identified herein are examples only, and any appropriate resource capable of being allocated may be used.

The memory bus 103 provides a data communication path for transferring data among the processor 101, the main memory 102, and the I/O bus interface unit 105. The I/O bus interface unit 105 is further coupled to the system I/O bus 104 for transferring data to and from the various I/O units. The I/O bus interface unit 105 communicates with multiple I/O interface units 111, 112, 113, and 114, which are also known as I/O processors (IOPs) or I/O adapters (IOAs), through the system I/O bus 104. The system I/O bus 104 may be, e.g., an industry standard PCI bus, or any other appropriate bus technology.

The I/O interface units support communication with a variety of storage and I/O devices. For example, the terminal interface unit 111 supports the attachment of one or more user terminals 121, 122, 123, and 124. The storage interface unit 112 supports the attachment of one or more direct access storage devices (DASD) 125, 126, and 127 (which are typically rotating magnetic disk drive storage devices, although they could alternatively be other devices, including arrays of disk drives configured to appear as a single large storage device to a host). The contents of the main memory 102 may be stored to and retrieved from the direct access storage devices 125, 126, and 127.

The I/O and other device interface 113 provide an interface to any of various other input/output devices or devices of other types. Two such devices, the printer 128 and the fax machine 129, are shown in the exemplary embodiment of FIG. 1, but in other embodiment many other such devices may exist, which may be of differing types. The network interface 114 provides one or more communications paths from the computer system 100 to other digital devices and computer systems; such paths may include, e.g., one or more networks 130.

Although the memory bus 103 is shown in FIG. 1 as a relatively simple, single bus structure providing a direct communication path among the processors 101, the main memory 102, and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, etc. Furthermore, while the I/O bus interface 105 and the I/O bus 104 are shown as single respective units, the computer system 100 may in fact contain multiple I/O bus interface units 105 and/or multiple I/O buses 104. While multiple I/O interface units are shown, which separate the system I/O bus 104 from various communications paths running to the various I/O devices, in other embodiments some or all of the I/O devices are connected directly to one or more system I/O buses.

The computer system 100 depicted in FIG. 1 has multiple attached terminals 121, 122, 123, and 124, such as might be typical of a multi-user "mainframe" computer system. Typically, in such a case the actual number of attached devices is greater than those shown in FIG. 1, although the present invention is not limited to systems of any particular size. The computer system 100 may alternatively be a single-user system, typically containing only a single user display and keyboard input, or might be a server or similar device which has little or no direct user interface, but receives requests from other computer systems (clients). In other embodiments, the computer system 100 may be implemented as a personal computer, portable computer, laptop or notebook computer, PDA (Personal Digital Assistant), tablet computer, pocket computer, telephone, pager, automobile, teleconferencing system, appliance, or any other appropriate type of electronic device.

The network 130 may be any suitable network or combination of networks and may support any appropriate protocol suitable for communication of data and/or code to/from the computer system 100. In various embodiments, the network 130 may represent a storage device or a combination of storage devices, either connected directly or indirectly to the computer system 100. In an embodiment, the network 130 may support Infiniband. In another embodiment, the network 130 may support wireless communications. In another embodiment, the network 130 may support hard-wired communications, such as a telephone line or cable. In another embodiment, the network 130 may support the Ethernet IEEE (Institute of Electrical and Electronics Engineers) 802.3x specification. In another embodiment, the network 130 may be the Internet and may support IP (Internet Protocol). In another embodiment, the network 130 may be a local area network (LAN) or a wide area network (WAN). In another embodiment, the network 130 may be a hotspot service provider network. In another embodiment, the network 130 may be an intranet. In another embodiment, the network 130 may be a GPRS (General Packet Radio Service) network. In another embodiment, the network 130 may be a FRS (Family Radio Service) network. In another embodiment, the network 130 may be any appropriate cellular data network or cell-based radio network technology. In another embodiment, the network 130 may be an IEEE 802.11B wireless network. In still another embodiment, the network 130 may be any suitable network or combination of networks. Although one network 130 is shown, in other embodiments any number (including zero) of networks (of the same or different types) may be present.

It should be understood that FIG. 1 is intended to depict the representative major components of the computer system 100 at a high level, that individual components may have greater complexity than represented in FIG. 1, that components other than or in addition to those shown in FIG. 1 may be present, and that the number, type, and configuration of such components may vary. Several particular examples of such additional complexity or additional variations are disclosed herein; it being understood that these are by way of example only and are not necessarily the only such variations.

The various software components illustrated in FIG. 1 and implementing various embodiments of the invention may be implemented in a number of manners, including using various computer software applications, routines, components, programs, objects, modules, data structures, etc., referred to hereinafter as "computer programs," or simply "programs." The computer programs typically comprise one or more instructions that are resident at various times in various memory and storage devices in the computer system 100, and that, when read and executed by one or more processors 101 in the computer system 100, cause the computer system 100 to perform the steps necessary to execute steps or elements comprising the various aspects of an embodiment of the invention.

Moreover, while embodiments of the invention have and hereinafter will be described in the context of fully functioning computer systems, the various embodiments of the invention are capable of being distributed as a program product in a variety of forms, and the invention applies equally regardless of the particular type of signal-bearing medium used to actually carry out the distribution. The programs defining the functions of this embodiment may be delivered to the computer system 100 via a variety of tangible signal-bearing media, which include, but are not limited to:

(1) information permanently stored on a non-rewriteable recordable storage medium, e.g., a read-only memory device attached to or within a computer system, such as a CD-ROM, DVD-R, or DVD+R;

(2) alterable information stored on a rewriteable recordable storage medium, e.g., a hard disk drive (e.g., the DASD 125, 126, or 127), CD-RW, DVD-RW, DVD+RW, DVD-RAM, or diskette; or (3) information conveyed by a communications medium, such as through a computer or a telephone network, e.g., the network 130, including wireless communications.

Such tangible signal-bearing media, when carrying machine-readable instructions that direct the functions of the present invention, represent embodiments of the present invention.

Embodiments of the present invention may also be delivered as part of a service engagement with a client corporation, nonprofit organization, government entity, internal organizational structure, or the like. Aspects of these embodiments may include configuring a computer system to perform, and deploying software systems and web services that implement, some or all of the methods described herein. Aspects of these embodiments may also include analyzing the client company, creating recommendations responsive to the analysis, generating software to implement portions of the recommendations, integrating the software into existing processes and infrastructure, metering use of the methods and systems described herein, allocating expenses to users, and billing users for their use of these methods and systems. In addition, various programs described hereinafter may be identified based upon the application for which they are implemented in a specific embodiment of the invention. But, any particular program nomenclature that follows is used merely for convenience, and thus embodiments of the invention should not be limited to use solely in any specific application identified and/or implied by such nomenclature.

The exemplary environments illustrated in FIG. 1 are not intended to limit the present invention. Indeed, other alternative hardware and/or software environments may be used without departing from the scope of the invention.

Figure 2:
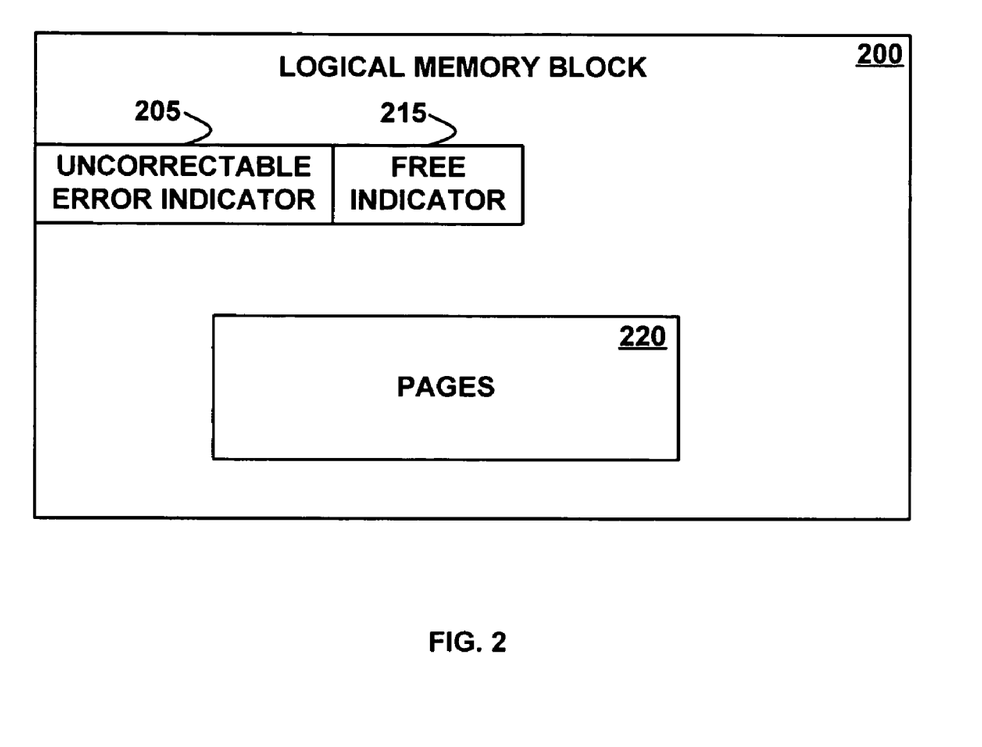
FIG. 2 depicts a block diagram of a logical memory block, according to an embodiment of invention.

FIG. 2 depicts a block diagram of a logical memory block 200, according to an embodiment of invention. The logical memory block 200 is the granular unit of the memory 102 (FIG. 1) that is allocated to the partitions 134 and the hypervisor 136. For example, in an embodiment, the logical memory block 200 includes 256 MB (megabytes) of the memory 102, and the memory 102 is allocated to the partitions 134 and hypervisor 136 in units of 256 MB. But, in other embodiments, any appropriate units may be used.

The logical memory block 200 includes an uncorrectable error indicator 205, a free indicator 215, and pages 220. The uncorrectable error indicator 205 indicates whether an uncorrectable error has occurred in one of the pages 220. The free indicator 215 indicates whether the logical memory block 200 is allocated to, or owned by, one of the partitions 134 or the hypervisor 136. A logical memory block 200 that is free is not allocated to either one of the partitions 134 or the hypervisor 136. A logical memory block 200 that is not free is allocated to either one of the partitions 134 or the hypervisor 136. The page 220 is the granular unit of the memory 102 that is allocated to the logical memory block 200. For example, each of the pages 220 may have a size of 4096 bytes, and the memory 102 is assigned to a logical memory block 200 in units of 4096 bytes, but in other appropriates any appropriate size may be used. In various embodiments, the page 220 may be the unit of memory that is transferred between the memory 102 and the processor 101, between the memory 102 and the storage devices 125, 125, and 127, or any other appropriate unit.

Figure 3:
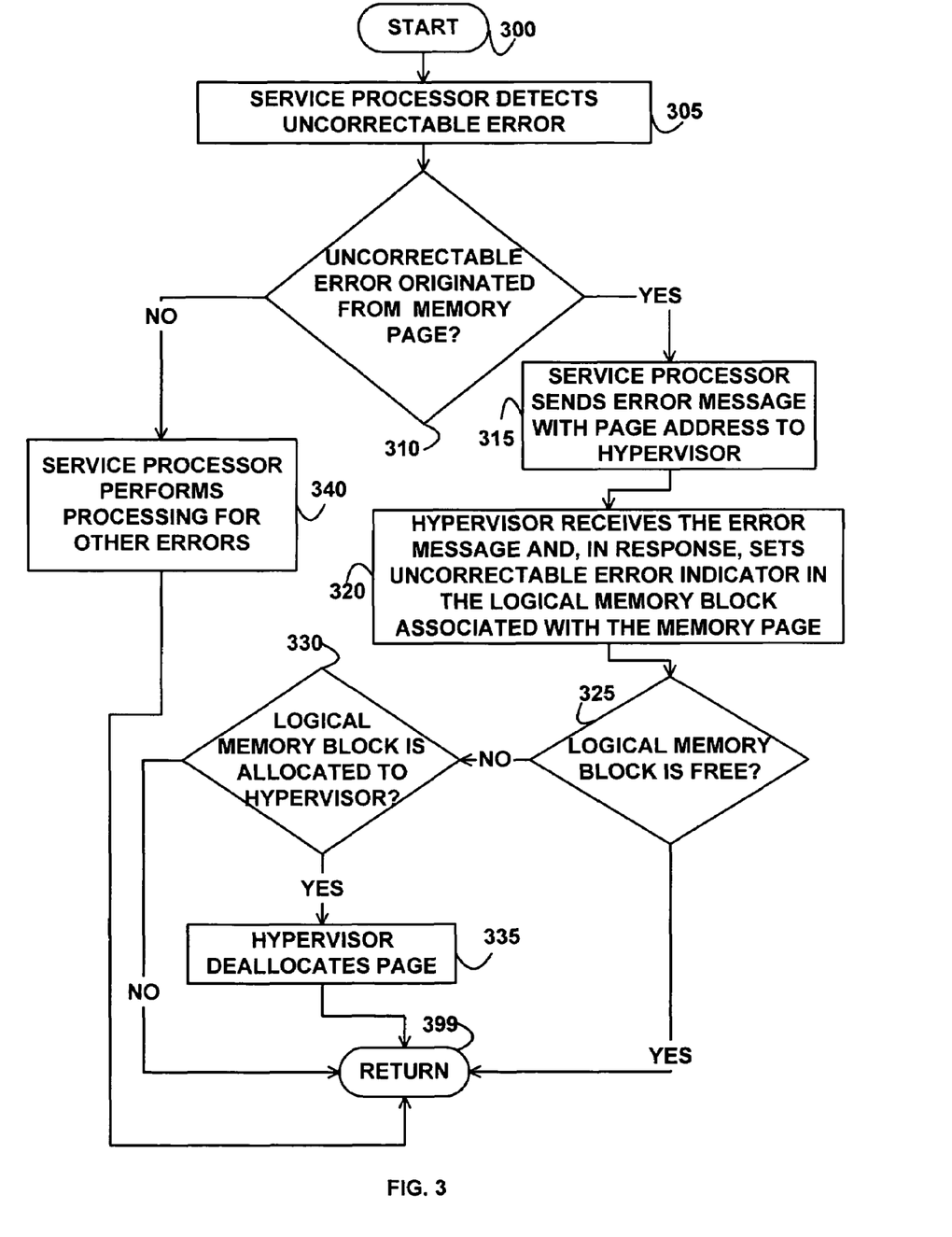
FIG. 3 depicts a flowchart of example processing for handling an uncorrectable error, according to an embodiment of the invention.

FIG. 3 depicts a flowchart of example processing for handling an uncorrectable error, according to an embodiment of the invention. Control begins at block 300. Control then continues to block 305 where the service processor 101D detects an uncorrectable error. Control then continues to block 310 where the service processor 101D determines whether the uncorrectable error originated from a page in the memory 102. If the determination at bock 310 is true, then control continues to block 315 where the service processor 101D sends an error message with the address of the memory page 220 that encountered the uncorrectable error to the hypervisor 136. Control then continues to block 320 where the hypervisor 136 receives the error message and, in response, sets the uncorrectable error indicator 205 in the logical memory block 200 associated with the address of the memory page 220 that encountered the uncorrectable error. Control then continues to block 325 where the hypervisor 136 determines whether the logical memory block 200 associated with the memory page 220 that encountered the uncorrectable error is free, i.e., is not allocated to either the hypervisor 136 or the logical partitions 134 by checking the free indicator 215. If the determination at block 325 is true, then control continues to block 399 where the logic of FIG. 3 returns.

If the determination at block 325 is false, then control continues to block 330 where the hypervisor 136 determines whether the logical memory block 200 is allocated to the hypervisor 136. If the determination at block 330 is true, then control continues to block 335 where the hypervisor 136 deallocates the page 220 from the hypervisor 136 in response to the detection of the uncorrectable error. Control then continues to block 399 where the logic of FIG. 3 returns.

If the determination at block 330 is false, then the logical memory block 200 is allocated to one of the logical partitions 134, so control continues to block 399 where the logic of FIG. 3 returns. Since the logical memory block 200 is allocated to one of the logical partitions 134, the hypervisor 136 will deallocate the logical memory block 200 with the uncorrectable error in response to the starting of the next IPL (initial program load) of the associated logical partition 134, as further described below with reference to FIG. 4.

If the determination at block 310 is false, then control continues to block 340 where the service processor 101D performs processing for other errors. Control then continues to block 399 where the logic of FIG. 3 returns.

Figure 4:
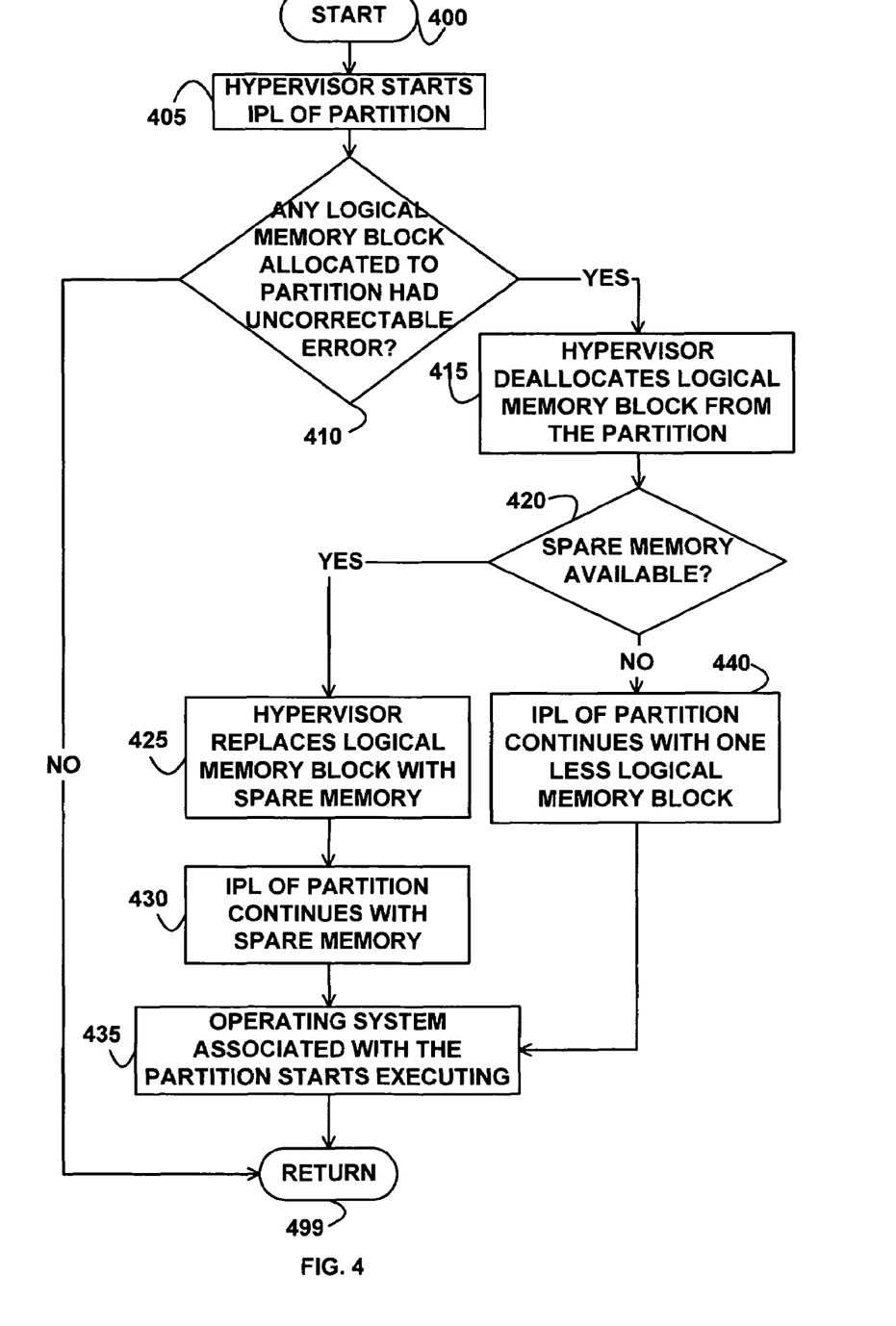
FIG. 4 depicts a flowchart of example processing for deallocating logical memory blocks in response to an IPL of a partition, according to an embodiment of the invention.

FIG. 4 depicts a flowchart of example processing for deallocating logical memory blocks in response to an IPL of a partition 134, according to an embodiment of the invention. Control begins at block 400. Control then continues to block 405 where the hypervisor 136 starts the IPL of a partition 134. Control then continues to block 410 where the hypervisor 136 determines whether any logical memory block 200 allocated to the partition 134 previously had an uncorrectable error by checking the uncorrectable error indicators 205 in all logical memory blocks 200 allocated to the partition 134. The hypervisor 136 performs the determination of block 410 without the participation of the operating system 142.

If the determination at block 410 is true, then control continues to block 415 where the hypervisor 136 deallocates from the partition 134 the logical memory block 200 that encountered the previous uncorrectable error. The hypervisor 136 performs the deallocation of block 415 without the participation of the operating system 142. Control then continues to block 420 where the hypervisor 136 determines whether spare memory in the memory 102 is available.

If the determination at block 420 is true, then control continues to block 425 where the hypervisor 136 replaces the deallocated logical memory block 200 with the spare memory by allocating the spare memory to the partition 134. Control then continues to block 430 where the IPL of the partition 134 continues with the spare memory. Control then continues to block 435 where the operating system 142 associated with the partition 134 starts executing.

Thus, in an embodiment, the determination of block 410 and the deallocation of block 415 are performed by the hypervisor 136 before the operating system 142 begins executing in the partition 134. In another embodiment, the operating system 142 is executing at the time that the hypervisor 136 performs the determination of block 410 and the deallocation of block 415, but the hypervisor 136 performs the determination of block 410 and the deallocation of block 415 without the participation of the operating system 142.

Control then continues to block 499 where the logic of FIG. 4 returns.

If the determination at block 420 is false, then control continues to block 440 where the IPL of the partition 134 continues with one less logical memory block, i.e., without the benefit of the deallocated logical memory block 200. Control then continues to block 435, as previously described above. If the determination at block 410 is false, then control continues to block 499 where the logic of FIG. 4 returns.

In the previous detailed description of exemplary embodiments of the invention, reference was made to the accompanying drawings (where like numbers represent like elements), which form a part hereof, and in which is shown by way of illustration specific exemplary embodiments in which the invention may be practiced. These embodiments were described in sufficient detail to enable those skilled in the art to practice the invention, but other embodiments may be utilized and logical, mechanical, electrical, and other changes may be made without departing from the scope of the present invention. Different instances of the word "embodiment" as used within this specification do not necessarily refer to the same embodiment, but they may. The previous detailed description is, therefore, not to be taken in a limiting sense, and the scope of the present invention is defined only by the appended claims.

In the previous description, numerous specific details were set forth to provide a thorough understanding of the invention. But, the invention may be practiced without these specific details. In other instances, well-known circuits, structures, and techniques have not been shown in detail in order not to obscure the invention.

What is claimed is:

1. A method comprising:
   starting an IPL of a first partition of a plurality of partitions in a logically-partitioned computer;
   in response to the starting, determining whether a logical memory block allocated to the partition previously encountered an uncorrectable error; and
   if the determining is true, deallocating the logical memory block from the first partition.

2. The method of claim 1, wherein the determining and the deallocating are performed by a hypervisor that manages the plurality of partitions.

3. The method of claim 2, wherein the determining and the deallocating are performed by the hypervisor without participation of an operating system that executes in the first partition.

4. The method of claim 2, wherein the determining and the deallocating are performed by the hypervisor before initializing an operating system that executes in the first partition.

5. The method of claim 1, further comprising:
   detecting the uncorrectable error in a memory page, wherein the logical memory block includes the memory page; and
   setting an uncorrectable error indicator associated with the logical memory block in response to the detecting.

6. The method of claim 5, further comprising:
   deallocating the memory page in response to the detecting if the memory page is allocated to a hypervisor that manages the plurality of logical partitions.

7. The method of claim 1, further comprising:
   replacing the logical memory block with spare memory if the spare memory is available; and
   continuing the IPL of the first partition with the spare memory.

8. The method of claim 1, further comprising:
   continuing the IPL of the first partition without the logical memory block if spare memory is not available.

9. A computer-readable storage medium encoded with instructions, wherein the instructions when executed comprise:
   starting an IPL of a first partition of a plurality of partitions in a logically-partitioned computer;
   in response to the starting, determining whether a logical memory block allocated to the partition previously encountered an uncorrectable error, wherein the determining is performed by a hypervisor that manages the plurality of partitions; and
   if the determining is true, deallocating the logical memory block from the first partition, wherein the deallocating is performed by the hypervisor.

10. The computer-readable storage medium of claim 9, wherein the determining and the deallocating are performed by the hypervisor without participation of an operating system that executes in the first partition.

11. The computer-readable storage medium of claim 9, wherein the determining and the deallocating are performed by the hypervisor before initializing an operating system that executes in the first partition.

12. The computer-readable storage medium of claim 9, further comprising:
   detecting the uncorrectable error in a memory page, wherein the logical memory block includes the memory page; and
   setting an uncorrectable error indicator associated with the logical memory block in response to the detecting.

13. The computer-readable storage medium of claim 12, further comprising:
   deallocating the memory page in response to the detecting if the memory page is allocated to a hypervisor that manages the plurality of logical partitions.

14. The computer-readable storage medium of claim 9, further comprising:
   replacing the logical memory block with spare memory if the spare memory is available; and
   continuing the IPL of the first partition with the spare memory.

15. The computer-readable storage medium of claim 9, further comprising:
   continuing the IPL of the first partition without the logical memory block if spare memory is not available.

16. A method for configuring a computer, comprising:
   configuring the computer to start an IPL of a first partition of a plurality of partitions in a logically-partitioned computer;
   configuring the computer to, in response to the starting, determine whether a logical memory block allocated to the partition previously encountered an uncorrectable error, wherein the determining is performed without participation of an operating system that executes in the first partition by a hypervisor that manages the plurality of partitions; and
   configuring the computer to, if the determining is true, deallocate the logical memory block from the first partition, wherein the deallocating is performed by the hypervisor.

17. The method of claim 16, further comprising:
   configuring the computer to detect the uncorrectable error in a memory page, wherein the logical memory block includes the memory page; and
   configuring the computer to set an uncorrectable error indicator associated with the logical memory block in response to the detecting.

18. The method of claim 17, further comprising:
   configuring the computer to deallocate the memory page in response to the detecting if the memory page is allocated to a hypervisor that manages the plurality of logical partitions.

19. The method of claim 16, further comprising:
   configuring the computer to replace the logical memory block with spare memory if the spare memory is available; and
   configuring the computer to continue the IPL of the first partition with the spare memory.

20. The method of claim 16, further comprising:
   configuring the computer to continue the IPL of the first partition without the logical memory block if spare memory is not available.

* * * * *